(12) United States Patent
Gui et al.

(10) Patent No.: US 7,440,081 B2
(45) Date of Patent: Oct. 21, 2008

(54) LITHOGRAPHIC APPARATUS, DEVICE MANUFACTURING METHOD, AND SUBSTRATE TABLE

(75) Inventors: Cheng-Qun Gui, Best (NL); Harmen Klaas Van Der Schoot, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 233 days.

(21) Appl. No.: 10/981,729

(22) Filed: Nov. 5, 2004

(65) Prior Publication Data

US 2006/0098176 A1    May 11, 2006

(51) Int. Cl.
  *G03B 27/72* (2006.01)
  *G03B 27/42* (2006.01)
(52) U.S. Cl. .......................................... 355/72; 355/53
(58) Field of Classification Search .................... 355/52, 355/72–76, 53; 361/234; 310/10, 12; 378/34, 378/35
See application file for complete search history.

(56) References Cited

U.S. PATENT DOCUMENTS

| | | | |
|---|---|---|---|
| 4,475,223 A * | 10/1984 | Taniguchi et al. .............. 378/34 |
| 4,737,824 A * | 4/1988 | Sakai et al. .................... 355/53 |
| 5,724,121 A * | 3/1998 | McKinley et al. ............. 355/53 |
| 6,529,266 B1 * | 3/2003 | Sandstrom .................... 355/72 |
| 6,570,752 B2 * | 5/2003 | Morita et al. ................ 361/234 |
| 6,927,839 B2 * | 8/2005 | Taniguchi et al. ............. 355/72 |
| 7,019,816 B2 * | 3/2006 | Ottens et al. .................. 355/72 |
| 7,070,661 B2 * | 7/2006 | Eiriksson et al. ............ 118/725 |

* cited by examiner

*Primary Examiner*—Hung Henry Nguyen
(74) *Attorney, Agent, or Firm*—Pillsbury Winthrop Shaw Pittman LLP

(57) ABSTRACT

A lithographic apparatus includes an illumination system to supply a beam of radiation, a patterning system serving to impart the beam of radiation with a pattern in its cross-section, a substrate table to support a substrate, and a projection system to project the patterned beam onto a target portion of the substrate. The substrate table includes a support member having an upper support surface for supporting at least part of the target portion of the substrate on a fluid cushion. The apparatus further includes a fluid supply system arranged to supply fluid to the upper support surface so as to provide the cushion, and an actuator system arranged to act on the support member. The actuator system is controllable to provide adjustment of a topography of the upper support surface relative to a reference plane. Compensation can thus be made for substrate thickness irregularities, to achieve correct focusing of the beam onto the target surface.

46 Claims, 4 Drawing Sheets

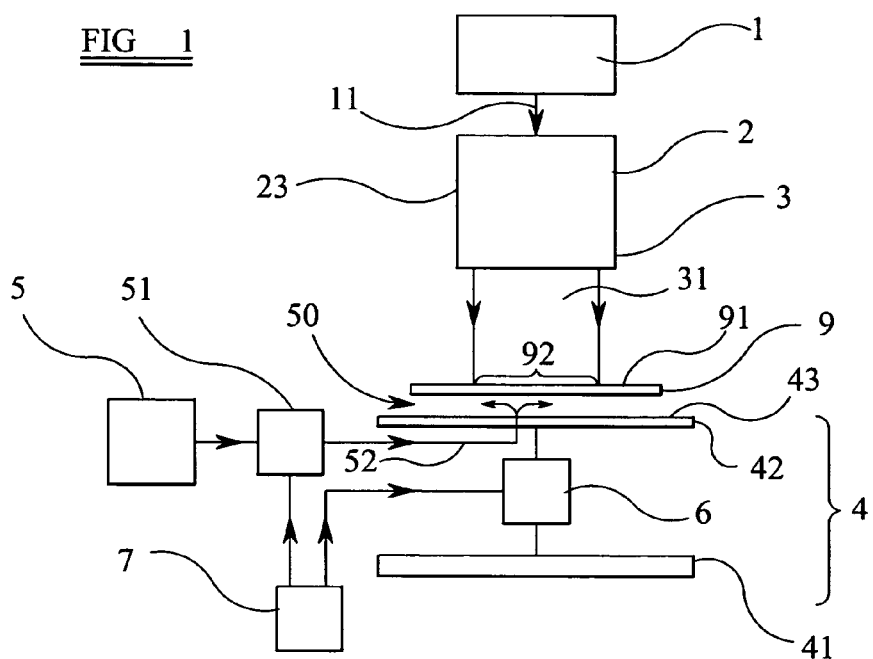
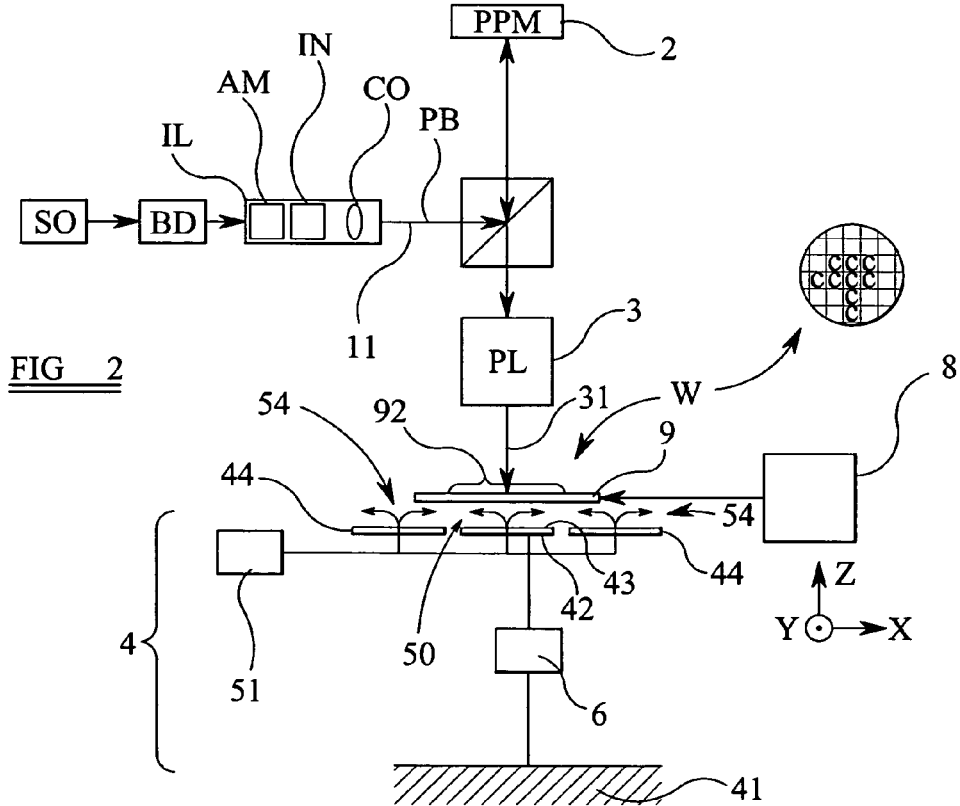

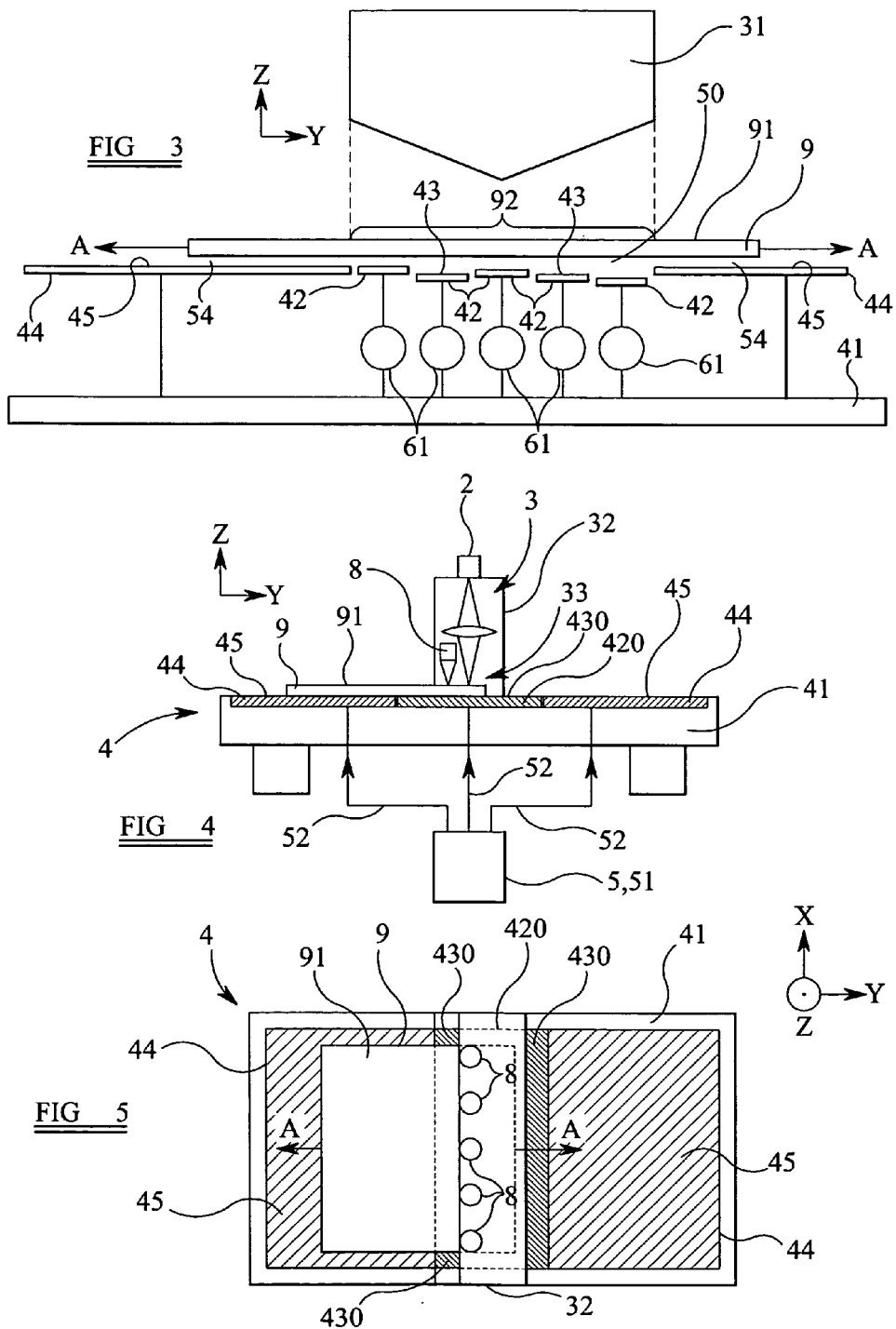

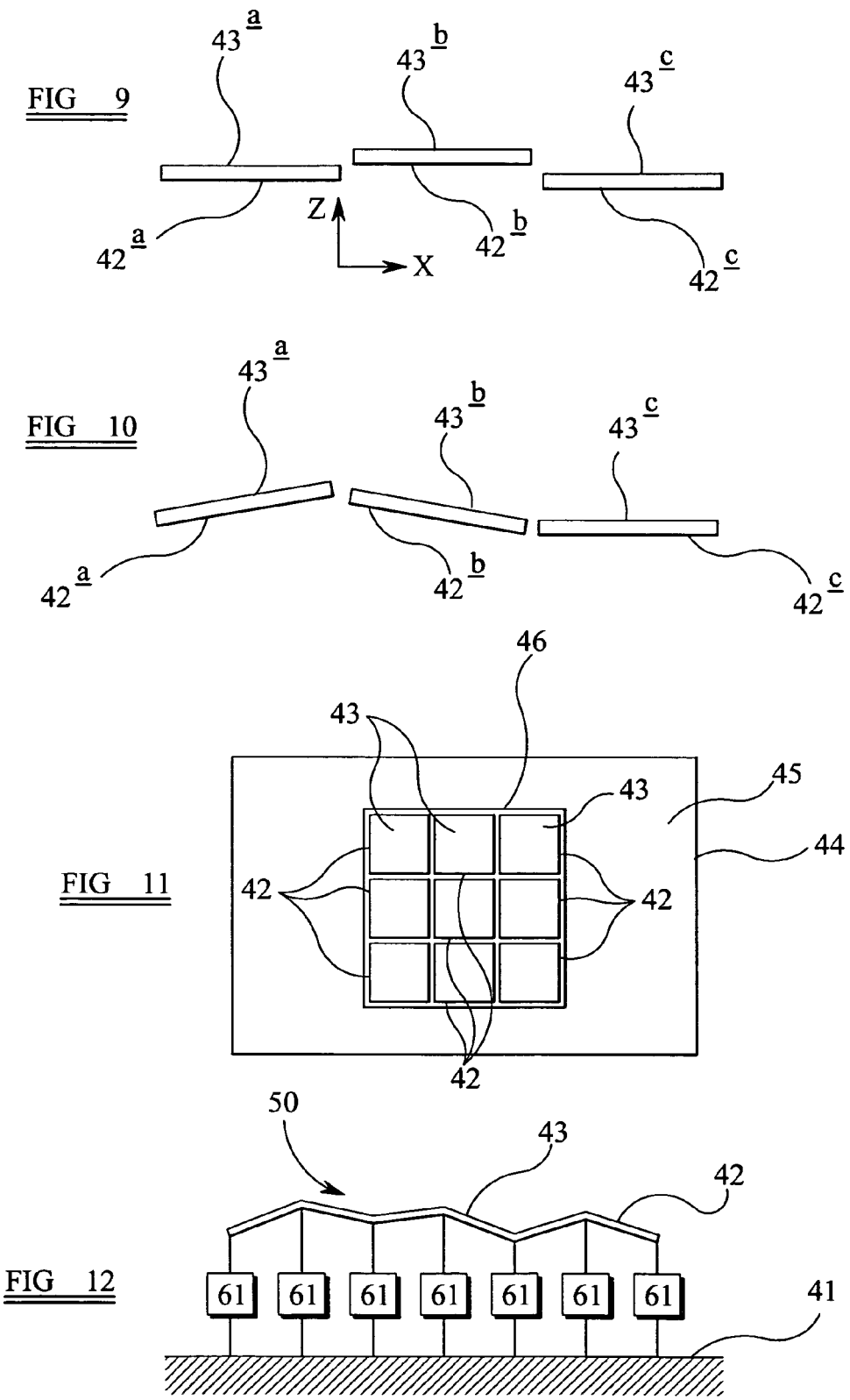

LITHOGRAPHIC APPARATUS, DEVICE MANUFACTURING METHOD, AND SUBSTRATE TABLE

FIELD

The present invention relates to a lithographic apparatus, a device manufacturing method, and a substrate table for use with such apparatus and method.

BACKGROUND

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning device, which is alternatively referred to as a mask or a reticle, may be used to generate a circuit pattern corresponding to an individual layer of the IC (or other device), and this pattern can be imaged onto a target portion (e.g. including part of, one or several dies) on a substrate (e.g. a silicon wafer or glass plate) that has a layer of radiation-sensitive material (resist). Instead of a mask, the patterning device may include an array of individually controllable elements which serve to generate the circuit pattern. Lithographic methods using such controllable (i.e. programmable) patterning device may be referred to as maskless techniques.

In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

During the exposure process the substrate is typically supported on a substrate table, and a projection system is used to project the patterned beam onto a surface (the target surface) of the target portion. The correct positioning of the target surface of the substrate with respect to the projection system is desirable to achieve the desired pattern on the substrate. For example, in maskless techniques, it is typically desirable to arrange the projection system such that it focuses the patterned beam to form a pattern of radiation spots on the target surface, each spot corresponding to a respective one of the controllable elements. The projection system is thus arranged to focus the patterned beam onto a target plane, and the substrate should be mounted on the substrate table such that the target surface is coincident with the focal plane. A problem, therefore, is how to achieve correct support of the substrate; if too high or low the patterned beam may not be correctly focused on the entire target area, and if the substrate is inclined with respect to the focal plane (i.e. if it is not "level") then only a portion of the target area may be in correct focus.

There is continual motivation for lithographic apparatus and methods to expose larger and larger substrates. One motivation for extending the size of the substrate is to reduce the manufacturing cost per device (chip, die, or display etc.). Normally, the integrated circuit (IC) or flat panel display (FPD) manufacturing technology evolves in terms of generations, and as the substrate sizes become larger and larger, the throughput (wafers per hour) or TACT time (Turn Around Cycle Time for processing one substrate) remains more or less the same. Thus, production efficiency is increased. Using FPD as an example, the glass substrate size (surface area) may increase by a factor of approximately 1.8 in going from one generation to the next, while the TACT time remains more or less constant (60 to 80 seconds). Thus, productivity increases by a factor of approximately 1.8 in going from one generation to the next. In flat panel display (FPD) technology, there is a continual desire to produce larger single screens, each being based on a single substrate over which devices have been produced using lithographic techniques. It will be appreciated that, as the substrates themselves become larger, the above-mentioned problems associated with the correct positioning of target surfaces with respect to projection systems, and those associated with the support of the substrate on rigid, moveable stages, are exacerbated.

Adjusting the focus and leveling for an FPD exposure system is challenging because, firstly, the substrate size may be large. It is envisaged that substrate sizes may be as large as 1.85×2.25 meters in the near future, and may be even larger as time progresses. Secondly, the total thickness variation (TTV) over such substrates is large. A typical TTV of a FPD substrate is 20 microns. Another problem is that the image field (in general terms, the size of the pattern projected onto the target surface in a single exposure step) is large. It is desirable to image single LCD TV screens (and indeed other forms of flat panel TV screens, such as PLED, OLED etc.) without stitching. This means that the exposure field of the lithography system will be at least as big as the largest display to be made (in the case of a stepper) and at least as long as one side of the largest display (in the case of a scan and step system). Currently, LCD TV screens are being produced with diagonal dimensions of about 32". In the near future LCD TV screens with diagonals in excess of 54" are anticipated. It will be appreciated that the projection system (optics) for projecting images onto such large LCD screens is itself large. Thus the problem of adjusting the focus and leveling of the exposure system by adjusting the projection optics alone is becoming increasingly difficult.

SUMMARY

Embodiments of the invention include a lithographic apparatus including: an illumination system for supplying a beam of radiation; a patterning system serving to impart the beam of radiation with a pattern in its cross-section; a substrate table for supporting a substrate; and a projection system for projecting the patterned beam onto a target portion of the substrate, wherein the substrate table includes a support member having an upper support surface for supporting at least part of the target portion of the substrate on a fluid cushion, and the apparatus further includes a fluid supply system arranged to supply fluid to the upper support surface so as to provide the fluid cushion; and an actuator system arranged to act on the support member and controllable to provide adjustment of a topography of the upper support surface relative to a reference plane (e.g. a horizontal base plane).

Thus, the actuator system is operable to adjust the topography of the upper surface. Thus, for substrates which are sufficiently thin and have a degree of flexibility, by adjusting the topography of the surface supporting the target portion (i.e. the portion exposed to the patterned beam), the topography of the target surface (i.e. the upper surface of the target portion) can in turn be adjusted. Adjustment of the topography of the surface of the support member can thus be used to compensate for non-uniformities in substrate thickness, and for other factors which may, if uncompensated, have resulted in parts of the target surface not being positioned correctly with respect to the projection system. In an embodiment of the invention, the projection system may be arranged to focus the patterned beam onto a target plane. In such embodiments, it is desirable that the target surface of the substrate be coincident with this target plane when exposed. Variations in substrate thickness can, however, result in localized or systematic deviations from this ideal. Embodiments of the invention are able to provide compensation. For example, to compensate for a region of reduced thickness, the surface of the support member beneath that region may be raised, so as to bring the corresponding part of the target surface up to the correct height, i.e. the height at which the patterned beam is correctly focused on the target surface.

In an embodiment of the invention, the support member may be rigid, in which case the adjustments of the topography of its upper surface are limited to those achievable by raising, lowering, and tilting the support member relative to a reference plane (typically a horizontal plane). In alternative embodiments, however, the support member may be flexible, and the actuator system may be arranged so as to provide a more extensive range of adjustments in surface topography. For example, the actuator system may include a plurality of actuators, each arranged to act on a respective portion of the support surface. Selected portions of the upper surface may thus be raised or lowered to suit requirements, independently of other portions. Thus, the support member may provide a deformable supporting surface actuated by one or more actuators. In yet a further embodiment of the invention, rather than using a deformable support member having a degree of flexibility, the target portion of the substrate may be supported on an array of substantially rigid movable support members, the actuator system being operable to adjust the height and/or tilt of each support member independently of the others. This is a convenient way of achieving compensation for localized substrate thickness variations over the target portion.

Thus, in an embodiment of the invention, the support member is movable and the actuator system is controllable to move the support member to provide adjustment of the topography. The substrate table may include a base, and the actuator system may then be controllable to move the movable support member relative to the base so as to provide the topography adjustment.

In an alternative embodiment of the invention, the support member is deformable and the actuator system is controllable to deform the support member to adjust the topography of the supporting surface. This deformation may be achieved by deflection, displacement, or other movement of selected portions of the support member relative to a table base, for example.

By supporting the entire substrate on a fluidbearing, the handling and scanning of large substrates may be facilitated. In an embodiment of the invention, the fluid is a gas (e.g. air). In alternative embodiments, however, the fluid may be a liquid.

In an embodiment of the invention, the support table includes at least part of the fluid (e.g. gas) supply system and/or at least part of the actuator system. For example, the support table may include a plurality of actuators, each arranged to actuate a respective controllable (movable/deformable) support member. The table may include a regulator for controlling the supply of gas from a source, and a system for conveying gas from the regulator to the upper surface(s) of the support member(s) to form the gas cushion. The table may include the fluid source, or the source may be separate.

In an embodiment of the invention, the patterning system includes an array of individually controllable elements, but in alternative embodiments the patterning system may include a mask, or reticle.

In an embodiment of the invention, the fluid supply system is arranged to supply the fluid up through the support member to the upper support surface. The support member may thus include pores, perforations, holes, or other conduits for conveying gas or other fluids through itself, and these conduits form part of the fluid supply system. Conveniently, the fluid may be air, although it will be appreciated that other gases may be used.

In an embodiment of the invention, the or each movable support member is rigid, and has a planar upper support surface. The actuator system may be operable to adjust at least one of a height and a tilt angle of the upper support surface relative to the reference plane. The actuator system may be operable to adjust a tilt of the upper support surface about a first axis, and a tilt of the upper support surface about a second axis relative to the reference plane.. The first and second axes may be mutually perpendicular.

In addition to at least one adjustable (e.g. movable and/or deformable) support member, the substrate table may include at least one fixed support member having a fixed upper support surface for supporting a portion of the substrate other than the target portion on a fluid cushion. The fluid supply system may then be arranged to supply fluid to the fixed upper support surface. The fixed support member may be fixed relative to a base of the support table, for example. In alternative embodiments of the invention, the fixed support member may be individually mounted to a floor on which the apparatus is positioned.

As mentioned above, the support table may include a plurality of movable support members, their upper surfaces defining a collective substrate-supporting surface whose topography may be adjusted by appropriate control of the actuator system. In an embodiment of the invention, the upper support surface of each movable support member is rectangular, although support surfaces having other shapes may be used. The movable support members may be arranged as a regular array. For example, they may be arranged in a row, a rectangular array of rows and columns, a hexagonal array, or a triangular array. Other forms of array may be used. In such examples, the actuator system may be operable to adjust at least one of a height and a tilt angle of the upper support surface of each movable support member relative to the reference plane.

The size of the movable support members and/or the number of movable support members may be determined according to the "waviness", or frequency of undulation, of the surface height topography of the substrate. For example, in an embodiment of the invention, the size of the or each movable element may be arranged to be ¼ of the wavelength of a characteristic undulation (the "main waviness") of the substrate surface topography. This provides efficient adjustment to the substrate surface undulation.

The movement of the movable support members, or equivalently the deformation of the deformable support member(s), in certain embodiments is a dynamic one. The substrate surface height may sometimes have to be adjusted while the substrate itself is moving. For example, the substrate may be moving above the air gap at a speed of 1000 mm/s, or at a speed of approximately 0.1 m/s during exposure, and at a velocity of approximately 1 m/s during a step part of the process (i.e. between exposures). This may require a high dynamic bandwidth for the movable members as well as the sensing system. It will be appreciated, however, that these velocities are merely possible examples; other movement speeds may of course be employed.

In an embodiment of the invention, the plurality of movable support members are located inside a window in the fixed upper surface of a surrounding fixed support member.

In an embodiment of the invention which includes fixed and movable support members, the fixed and movable support members together define a collective substrate support surface able to support the entire substrate on an air (or other fluid) cushion. The topography of a portion of this support surface is adjustable, to provide corresponding adjustment of the topography of a target surface of the supported substrate.

In an embodiment of the invention, the lithographic apparatus further includes a sensor system arranged to detect the height of an upper surface of a substrate supported by the substrate table, and a control system responsive to the sensor system to control the actuator system to adjust the topography of the upper support surface of one or more of the support members according to the detected height. The sensor system may be arranged to detect the topography of an upper surface of a substrate supported by the substrate table, and the control system may then be responsive to the sensor system to control the actuator system to adjust the topography of the support surface defined by the movable support member(s) according to the detected topography.

In an embodiment of the invention, the sensor system is arranged to detect the topography of an upper surface of the target portion of substrate that is supported by the plurality of movable support members.

Thus, in an embodiment of the invention, the sensor system may be arranged to detect the height of the upper surface of a supported substrate at a single position on that upper surface. That position may be in the target surface, or may be outside it (e.g. the sensor may detect substrate height at a position just outside the area being exposed by the patterned beam). In an alternative embodiment of the invention, the sensor system may be arranged to detect a topography of a portion of the upper surface of a target substrate, i.e. it may measure height at a plurality of positions to give an indication of the variation of height over that area. In another embodiment of the invention, the area whose topography is detected (measured) may be a portion of the target area, may include all of the target area, may consist of part of the target area and an area outside the target area, or may consist of an area outside (e.g. adjacent to) the target area. The sensor system may, in certain embodiments of the invention, be described as a focus and/or leveling sensor system, as its output may be used by the control system to adjust the movable support members so as to level the target surface of the substrate such that it is coincident with the focal plane of the projection system.

Lithographic apparatus in accordance with an embodiment of the invention may further include a movement system arranged to move a supported substrate relative to the base so as to position a different target portion of the substrate over the movable/deformable support member(s). This movement system may be adapted to scan a supported surface in at least one of two mutually perpendicular directions, and may further include a position sensing system arranged to detect the position of the supported substrate relative to the base.

According to another embodiment of the invention there is provided a device manufacturing method including: providing a substrate; supporting the substrate on a substrate table, including supporting at least part of a target portion of the substrate on a fluid cushion on an upper support surface of a support member; detecting the height, relative to a reference plane, of an upper surface of the substrate supported by the substrate table; adjusting a topography of the upper support surface, relative to the reference plane, so as to effect a desired change in the height; providing a beam of radiation using an illumination system; imparting the beam of radiation with a pattern in its cross-section; and projecting the patterned beam of radiation onto the target portion of the substrate.

In an embodiment of the invention, the act of detecting includes detecting a height of a surface of part of the target portion of the substrate supported by the support member. The change in height may be arranged so as to position the corresponding part of the upper surface on the focal plane of the system used to project the patterned beam. The act of supporting may include supporting the target portion of the substrate on a gas cushion on the upper support surfaces of a plurality of movable support members, the act of detecting may include detecting a topography of an upper surface of the substrate relative to the reference plane, and the act of moving may include selectively moving the support members to adjust a topography of their upper surfaces so as to effect a desired change to the topography of said upper surface of the supported substrate.

In an embodiment of the invention, the detected topography is a topography of at least part of the target surface of the substrate (i.e. of the upper surface of the target portion).

Another embodiment of the invention provides a substrate table for a lithographic apparatus of the type including an illumination system for supplying a beam of radiation, a patterning system serving to impart the beam of radiation with a pattern in its cross-section, and a projection system for projecting the patterned beam onto a target portion of a substrate supported by the substrate table, wherein the substrate table includes: a support member having an upper support surface for supporting at least part of the target portion of the substrate on a fluid cushion; a fluid conveying system arranged to convey fluid to said upper support surface so as to provide said fluid cushion; and an actuator system arranged to act on the support member and controllable to provide adjustment of a topography of the upper support surface relative to a reference plane.

The term "patterning system" as here employed should be broadly interpreted as referring to any system that can be used to endow an incoming radiation beam with a patterned cross-section, so that a desired pattern can be created in a target portion of the substrate. The patterning system may, for example, include a fixed mask. Alternatively, it may include an array of individually controllable elements, and in such instances may be described as a programmable patterning device; the terms "light valve" and "Spatial Light Modulator" (SLM) can also be used in this context.

Examples of such patterning devices (including controllable elements) include:

A programmable mirror array. This may include a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices can also be used in a corresponding manner. Each diffractive optical MEMS device is comprised of a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the array of individually controllable elements can include one or more programmable mirror arrays. More information on mirror arrays as here referred to can be gleaned, for example, from United States Patents U.S. Pat. Nos. 5,296,891 and 5,523,193, and PCT patent applications WO 98/38597 and WO 98/33096, which are incorporated herein by reference.

A programmable LCD array. An example of such a construction is given in United States Patent U.S. Pat. No. 5,229,872, which is incorporated herein by reference.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 355, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. For example, an immersion lithography technique may be used, with the immersion liquid being kept above the substrate. An air bearing system may be used, including pressurized air to support the substrate and a vacuum (or in general low pressure) to attract the substrate, therefore keeping the substrate in place. Thus, the air bearing support may or may not be pre-loaded using vacuum (or low pressure). Rather than an air bearing, certain embodiments of the invention utilize a liquid/hydrostatic bearing. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Although concerned in general with the support of a wide variety of substrates, embodiments of the invention are especially concerned with the problem of supporting large substrates, and in particular, although not exclusively, FPD substrates.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIG. 2 depicts a lithographic apparatus in accordance with an embodiment of the invention;

FIG. 3 depicts part of a lithographic apparatus in accordance with an embodiment of the invention;

FIG. 4 is a schematic cross section of part of a lithographic apparatus in accordance with an embodiment of the invention;

FIG. 5 is a schematic plan view of the apparatus shown in FIG. 4;

FIG. 9 is a schematic side view of moveable support members suitable for use in embodiments of the invention;

FIG. 10 is a schematic side view of controllable support members suitable for use in embodiments of the invention;

FIG. 11 is a schematic plan view of a support table in accordance with an embodiment of the invention; and FIG. 12 is a schematic side view of part of a support table in accordance with an embodiment of the invention.

DETAILED DESCRIPTION

Figure 6:
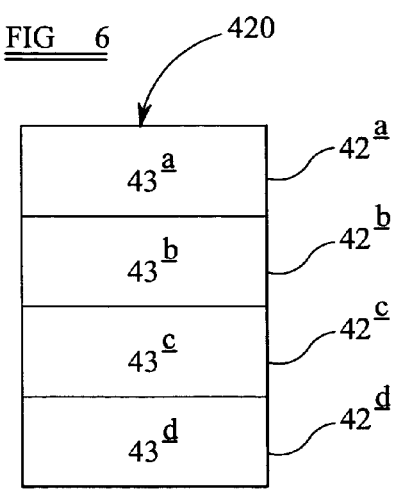
FIG. 6 is a schematic plan view of a controllable support surface for use in embodiments of the invention.

Referring now to FIG. 1, this figure shows a lithographic apparatus in accordance with an embodiment of the invention. The apparatus includes an illumination system 1 arranged to supply a beam of radiation 11. The beam of radiation 11 is received by a combined beam patterning and beam projection system 23. This combined system includes a patterning device 2 arranged to impart the beam of radiation 11 with a pattern in its cross section. The patterning device make take a variety of forms. For example, it may, in an embodiment of the invention, include a plurality of controllable elements, and may also include a mask or reticle, in an alternative embodiment of the invention. The patterning device may be of the reflective or transmissive type. The combined system 23 also includes a projection system 3 arranged to project the patterned beam 31 onto a target portion 92 of a substrate 9. The projection system 3 thus directs the patterned beam 31 onto a target area of the upper surface 91 of the substrate 9. In this embodiment of the invention, the substrate 9 is supported on an air cushion 50 by a substrate table 4. In other words, the substrate 9 is supported on an air bearing. The substrate table 4 includes a fixed base 41 and a moveable support member 42 which has an upper support surface 43 arranged in this example, to support the entire target portion 92 of the substrate. An air supply system is arranged to provide the air cushion 50. This air supply system includes a compressed air source 5 and a controllable regulator 51 arranged to control supply of air from the source 5 via a conduit 52, up through pores in the moveable support member 42 to its upper surface 43. It will be appreciated that the conduit 52 supplying the air and the porous moveable support member 42 maybe arranged such that the supplied air is distributed substantially uniformly over the upper surface 43. In an embodiment of the invention, the movable support member may have a surface that has air supplies (holes) at a certain pitch (e.g. 10-100 mm). Other forms of "porous" (or, equivalently, perforated) surfaces may be used. The substrate table 4 also includes an actuator system 6, which is controllable to move the moveable support member 42 relative to the base 41 so as to provide adjustment of a topography of the upper support surface 43 relative to a horizontal reference plan. Thus, the actuator system is able to act on the moveable support member 42 so as to adjust (i.e. alter) the topography of its upper surface 43. The substrate 9 in this example may be a relatively thin, large substrate for a flat panel display and has a degree of flexibility. Thus, by adjusting the topography of the upper surface 43 of the support member 42, the topography of the upper surface 91 of the substrate 9 may itself be affected, as the substrate is supported on the upper surface 43 using the gas cushion 50. In this example, a control unit 7 (e.g. a computer/microprocessor) is arranged to control both the air supply regulator 51 and the actuator system 6. The substrate table 4 may include the control unit 7, the regulator 51, and the air supply 5. In alternative embodiments, however, one or more of these items may be provided separately from the substrate table 4.

FIG. 2 schematically depicts a lithographic projection apparatus according to an embodiment of the invention. The apparatus includes an illumination system (illuminator) IL configured to condition a beam PB, 11 of radiation (e.g. UV radiation); an array of individually controllable elements PPM, 2 (e.g. a programmable mirror array) configured to apply a pattern to the beam of radiation; in general the position of the array of individually controllable elements may be fixed relative to the projection system ("lens"), item PL; however it may instead be connected to a positioning device configured to accurately position it with respect to the projection system ("lens"), item PL. The apparatus also includes a substrate table (e.g. a wafer table) 4 configured to hold/support a substrate 9 (e.g. a resist-coated wafer) W, and a substrate positioning system 8 configured to accurately position the supported substrate with respect to the projection system ("lens"), item PL, the projection system ("lens") PL, 3 being configured to image a pattern imparted to the beam of radiation PB by the array of individually controllable elements PPM onto a target portion C, 92 (e.g. including one or more dies) of the substrate W. The projection system may image the array of individually controllable elements onto the substrate; alternatively, the projection system may image secondary sources for which the elements of the array of individually controllable elements act as shutters; the projection system may also include a micro lens array (known as an MLA), e.g. to form the secondary sources and to image microspots onto the substrate.

As here depicted, the apparatus is of a reflective type (i.e. has a reflective array of individually controllable elements). However, in general, it may also be of a transmissive type, for example (i.e. with a transmissive array of individually controllable elements).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the beam of radiation PB, having a desired uniformity and intensity distribution in its cross-section.

The projection beam PB subsequently intercepts the array of individually controllable elements PPM. Having been reflected by the array of individually controllable elements PPM, the beam of radiation PB passes through the projection system PL, which focuses the beam of radiation PB onto a target portion C, 92 of the substrate W, 9.

The substrate table includes a plurality of support members. A central support member 42 is movable, and the table includes an actuator 6 which is controllable to adjust the topography of an upper support surface 43 of the member 42. This movable member supports the target portion 92 of the substrate. On either side of the movable member 42 are fixed support members 44. These are immovable with respect to the table base 41 and provide fixed, horizontal support surfaces 44 to support portions of the substrate not being exposed to the patterned beam 31. The table includes a compressed air supply system which includes a regulator 51 and which supplies air up through suitably arranged conduits in each of the support members 42, 44 to provide an air cushion 54, 50 between the substrate and the support members. Thus, the substrate is not in direct physical contact with the members, but is supported on them via the air cushion 54, 50, which may be referred to as an air bearing. By adjusting the topography of the central support member upper surface the topology of the target surface can thus be adjusted.

With the aid of the positioning device 8 (which may include an interferometric measuring system), the substrate can be moved accurately, e.g. so as to position different target portions C in the path of the projection beam Where used, the positioning device for the array of individually controllable elements can be used to accurately correct the position of the array of individually controllable elements PPM with respect to the path of the projection beam PB, e.g. during a scan. In general, movement of the substrate is realized with the aid of a long-stroke module (coarse positioning) and a short-stroke module (fine positioning), which are not explicitly depicted in FIG. 2. A similar system may also be used to position the array of individually controllable elements. It will be appreciated that the projection beam may alternatively/additionally be moveable while the substrate and/or the array of individually controllable elements may have a fixed position to provide the required relative movement. However, FIG. 2 depicts an arrangement that is especially applicable in the manufacture of flat panel displays, in which the positions of the substrate table and the projection system are fixed and the substrate is arranged to be moved relative to the substrate table. For example, the positioning system 8 may be a system for scanning the substrate across the table 4 on an air bearing at a substantially constant velocity.

Although the lithography apparatus according to an embodiment of the invention is herein described as being for exposing a resist on a substrate, it will be appreciated that the invention is not limited to this use and the apparatus may be used to project a patterned projection beam for use in resistless lithography.

Apparatus of the general type depicted in FIG. 2 may be used in various modes:

Step mode: the array of individually controllable elements imparts an entire pattern to the beam of radiation, which is projected onto a target portion C at once (i.e. a single static exposure). The substrate W is then shifted in the X and/or Y direction so that a different target portion C can be exposed. In step mode, the maximum size of the exposure field limits the size of the target portion C imaged in a single static exposure.

Scan mode: the array of individually controllable elements is movable in a given direction (the so-called "scan direction", e.g. the Y direction) with a speed v, so that the beam of radiation PB is caused to scan over the array of individually controllable elements; concurrently, the substrate W is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

Pulse mode: the array of individually controllable elements is kept essentially stationary and the entire pattern is projected onto a target portion C of the substrate using a pulsed radiation source. The substrate W is moved with an essentially constant speed such that the projection beam is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

Continuous scan mode: essentially the same as pulse mode except that a substantially constant radiation source is used and the pattern on the array of individually controllable elements is updated as the projection beam scans across the substrate and exposes it.

Combinations and/or variations on the above described modes of use or entirely different modes of use may also be employed.

Referring now to FIG. 3, this figure shows a substrate table in accordance with an embodiment of the invention and supporting a substrate 9. A beam supply, patterning and projection system (not shown in FIG. 3) is directing a patterned beam 31 onto a target portion 92 of the substrate 9. The substrate table includes a plurality of moveable support members 42, each having a respective flat, horizontal upper support surface. Due to a system not shown in FIG. 3, a cushion of gas 50 is provided between the moveable support members 42 and the supported substrate 9. The substrate table includes further support members 44 which are fixed with respect to the base 41. These fixed support members 44 have fixed, horizontal upper surfaces 45 and the gas supply system is also arranged to provide gas cushions 54 by means of which the fixed support members support portions of the substrate other than the target portion 92. The substrate 9 is thus supported on an air bearing by a combination of fixed and moveable bearing surfaces (45 & 43 respectively). The substrate table includes an actuator system which includes a plurality of individually controllable actuators 61, each one arranged to control the height of a respective one of the moveable support members 42. Each moveable support member 42 supports a respective part of the target portion 92 of the substrate 9. By suitable control of the actuators 61, the heights of the moveable members 42 relative to the base 41 can be selectively adjusted so as to adjust the topography of the target area of the substrate (i.e. the variation of height with respect to the base 41 over that area) which is exposed to the patterned beam 31. As the substrate 9 is supported on a gas cushion 50, 54 it may easily be moved in the general horizontal plane (as indicated by arrows A) to bring a different target portion of the substrate into position, over the controllable support members 42 and under the projected, patterned beam 31. The substrate table thus provides convenient handling of large substrates, such as those used in the production of flat paneled displays, and the support of the target portion on an array of moveable support members 42 enables localized corrections to the height of the target surface to be made, to correct for variations in substrate thickness, air cushion thickness variations, and possible non-uniformities in one or more of the nominally flat support surfaces to be made. For example, if part of the target portion 92 is significantly thinner than the surrounding portions, it may be lifted in the Z direction by raising the moveable support member 42 supporting it, thereby bringing its upper surface to the correct height such that the patterned beam 31 is focused on it.

Referring now to FIG. 4, this shows a schematic cross section of a lithographic apparatus in accordance with a further embodiment to the invention. A projection system is indicated generally by reference number 3, and receives a patterned beam from a patterning device 2 and focuses that patterned beam onto the target portion of a substrate 9. The projection system 3 nominally focuses the patterned beam to form a plurality of radiation spots on the target surface. This focusing is indicated generally by reference 33. The projection system is mounted in a frame 32 which extends across the width of the table 4. A plurality of focus and leveling sensors 8 is also mounted within the frame 32. Each focus and leveling sensor detects a height of the upper surface 91 of part of the target substrate and its output signal is used by a control unit (not shown in the figure) to determine whether any adjustment of the topography of the upper surface of the target portion is required to ensure correct focusing of the patterned beam by the projection optics 3. The substrate 9 is supported on a substrate table 4 which is an air-bearing table. The topography of the top surface 91 of the substrate may depend mainly on the following three factors:

The TTV of the substrate;

The air gap uniformity; and

The flatness of the table support surface. The TTV is a fixed factor for a given substrate while the air gap uniformity depends on the air bearing mechanism. It will be appreciated that the air supply system to the bearing surfaces can be arranged to achieve a high degree of air gap uniformity. The topography of the upper surface 91 of the substrate can then be varied by adjusting the supporting surface underneath the air gap. The air gap is typically ten to hundreds of microns. The substrate table provides a bearing surface 45, 430 (i.e. a surface on which the substrate 9 rests on the air cushion) which, in this example, includes three regions. A central region 430 of the upper support surface supports the target portion of the substrate and is the upper surface of a portion of the table 420 which includes at least one moveable support member. The table also includes an actuation system which is able to act on the moveable support member or members so as to alter the topography of the surface 430 supporting the target portion. To the left and right of the central surface portion 430 in FIG. 4, there are rigid support surfaces 45 which are the flat, upper surfaces of support members 44 that are fixed (i.e. immovable) with respect to the table base 41. These fixed upper surface portions 45 can thus provide support, via air cushions, to portions of the substrate 9 other than the target portion being illuminated by the projection system 3. Thus, in this example, rather than the entire air-bearing support surface being adjustable, its topography is controllable only over a central portion which supports the target portion of the substrate. The air cushion or cushions on which the substrate is supported is provided using a combined air source and regulation unit 5, 51 and conduits 52 conveying the air to lower surfaces of the fixed and moveable support members 44, 45. Each of the fixed and moveable support members in this example includes pores such that air supplied to its lower surface can flow up, through the member, to the upper supporting surface 45, 430.

Although not explicitly shown in FIG. 4, it will be appreciated that, in general, the apparatus will include a control system in which the signal from the sensor system is fed to a processor, which in turn provides a signal, which controls the actuator system to adjust the topography of the supporting surface. The processor and control system may be integrated. Two ways to achieve this topography adjustment are as follows.

Firstly, the actuator system may be arranged in a feedback system with the substrate level sensor system. In this case, the sensor system may be arranged to measure in/around the actuated area (i.e. it is responsive to the topography of the portion of the substrate whose topography is controllable with the actuator system).

Secondly, one may measure the substrate using a substrate level sensor, process the data and use this to generate a setpoint for the actuator system. The actuator system may include a feedback loop, but the sensor of this system is not the substrate level sensor (it measures the actuator with respect to a frame part).

Referring to FIG. 5, one can see that in this example, the leveling and focusing system (sensor system) includes a plurality of sensors 8, spaced apart across the entire width of the substrate 9. The projection system 3 is also arranged to project a suitably patterned beam across the entire substrate width. The projection system may include multiple optical engines assembled in an array or a matrix. The transverse extent of the projected patterned beam is referred to as a slit width, and it will be seen that in this example the slit width generally corresponds to the substrate width such that no movement of the substrate 9 is required in the X direction. Thus, in order to expose the entire substrate surface 91, the substrate 9 can be scanned in the direction indicated generally by the arrows A. The array of sensors 8 extending across the substrate width provide an indication of target surface topography (i.e. the variation of target surface height as one moves across the width of the substrate). The array of sensors 8 is arranged to provide signals to a control system which in turn controls the actuator system to adjust the topography of the central portion 430 of the air-bearing surface so as to bring the targeted substrate surface into the correct position with respect to the beam patterning and projection system over as much of the target area as possible.

In one, simple form, the central adjustable portion of support surface 430 is the upper surface of a single, rigid tile. In such examples, the actuator system may be arranged to provide adjustment of tile height (i.e. enabling the tile's upper surface 43 to be moved in the Z direction), and to provide control of the tile's tilt about one or more axes. For example, the actuator system maybe arranged to provide controllable tilt about two mutually perpendicular horizontal axes (such as the X and Y axes in FIG. 5). With an air gap of a few tens of microns, a suitable Z adjustment range of the top surface of the tile upper surface is in the range of a few microns to a few tens of microns.

Instead of a single tile, the central target-supporting portion of the table can, in alternative embodiments, be divided into smaller tiles. One such arrangement is shown in FIG. 6, where the controllable part of the bearing includes four rectangular tiles 42a-d, each providing a corresponding flat, rigid upper supporting surface 43a-d. The actuator system in an embodiment of the invention is arranged such that each tile is adjustable independently in Z, rotation about an X axis ($R_x$) and about Y axis (Ry). Such arrangements provide even finer adjustment of the topography of the top surface (i.e. the target surface) of the substrate.

Figure 7:
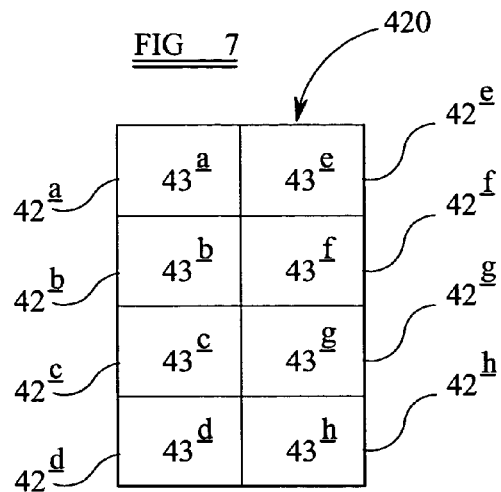
FIG. 7 is a schematic plan view of yet another controllable support surface suitable for use in embodiments of the invention.

FIG. 7 shows yet another arrangement where the controllable part of the bearing includes a regular, rectangular array of square tiles 42a-h, each having a corresponding rigid upper support surface 43a-h. Again, the actuator system can be arranged such that the height and tilt of each tile is adjustable independently of the others. Conveniently, the actuator system may include separate actuators for each tile. It will be appreciated that the greater the number of separately controllable moveable elements supporting the target portion of the substrates, the greater the control over the target area topography. The whole substrate may be supported by the movable support members.

As mentioned above, the sensor system 8 may be arranged to provide an input to a control unit, which in turn controls the actuator system adjusting the topography of the bearing surface 430. Thus, in an embodiment of the invention, there is provided a feed back control between the metrology system (e.g. the focus sensor and the leveling sensors) and the table or tiles position adjusting mechanism.

In addition to correcting for non-uniformities in substrate thickness, embodiments of the invention are also able to compensate for air gap non-uniformity. If the air gap non-uniformity error is a schematic one, this error can be compensated by adjusting the position in Z, $R_x$, $R_y$ of the moveable support member or members (e.g. tiles).

It will be appreciated that the actuator system of embodiments of the invention may incorporate a wide variety of actuation mechanisms. The actuator system is not limited to any particular mechanism, but suitable actuators include magnetic, electrostatic, and pneumatic.

Figure 8:
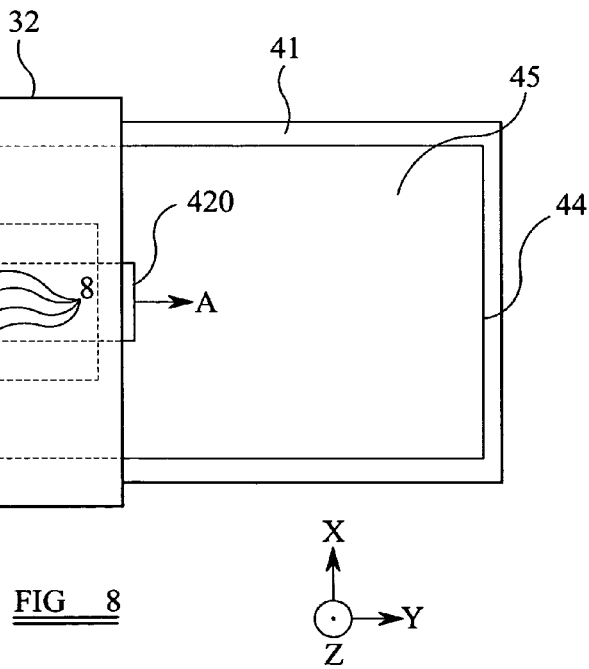
FIG. 8 is a schematic plan view of part of a lithographic apparatus in accordance with an embodiment of the invention.

Referring now to FIG. 8, this is a plan view of part of a lithographic apparatus embodying the invention and whose side view is the same as that shown in FIG. 4. As with the embodiment of FIG. 4, the projection system frame 32 extends across the width of the table base 41. However, in this example, the slit width of the projection system extends across only a limited portion of this width, and can illuminate only a limited portion of the width of the substrate 9 in a single exposure step. The apparatus includes a focus and leveling sensor system including a plurality of sensors 8. These sensors are distributed so as to provide an indication of the topography of an area of the upper surface 91 of the substrate 9 having a width generally corresponding to the slit width. In other words, the sensor system measures a topography of an area of the substrate to be exposed by the patterned beam in a single exposure step.

As the slit width of the apparatus in FIG. 8 is shorter than that of the apparatus shown in FIGS. 4 & 5, the controllable portion 420 of the bearing surface is correspondingly smaller. In the example of FIG. 8, the extent of the controllable portion 420 in the X direction is just slightly longer than the slit width. Again, the support table is arranged such that topography control is provided only for the target portion of the substrate. Portions other than the target portion are supported by the fixed support member 44, having a flat, rigid upper support surface 45.

In order to expose the entire substrate surface 91, the apparatus of the embodiment shown in FIG. 8 also includes a system configured to move (i.e. scanning) the substrate 9 in the nominal Y direction (as indicated by arrows A) and also in the nominal X direction (as indicated by arrows B). Thus, the apparatus includes a controllable system for scanning the substrate supported on an air bearing over the table bearing surface so as to bring different target portions of the surface over the controllable support and under the projection system.

It will be appreciated that although FIG. 8 shows a sensor system 8 that is fixed in the frame 32, relative to the table base 41, and movement of the substrate is in the X and Y directions, in alternative embodiments exposure across the full width of the substrate may be achieved by keeping the substrate at a fixed position with respect to the X axis and then scanning the projection and metrology system in the X direction with respect to the table base. In such examples, the controllable portion 420 of the table surface may extend across the full width of the substrate.

FIGS. 9 and 10 are schematic illustrations of the types of adjustment of the moveable support members of substrate tables in accordance with embodiments of the invention. In FIG. 9, the substrate table includes three moveable support members (or tiles) and the actuator system has adjusted the Z position of each one to provide variation in the height of the upper support surface they collectively provide. In FIG. 10, the actuator system has, in addition to adjusting the heights of the moveable members, also adjusted the tilt of two of the tiles (i.e. it has adjusted their inclinations with respect to a horizontal plane).

Moving onto to FIG. 11, this figure is a schematic illustration of the bearing surface of a substrate table in accordance with an embodiment of the invention. The bearing surface includes a fixed rectangular portion 45 having a square window 46 generally at its center. Inside this window, there is positioned a regular array of moveable support members 42, each one having a respective square upper surface 43. Thus, the topography of the portion of a substrate supported over the window can be adjusted by selective movement of one or more of the support members 42.

It will be appreciated that in embodiments of the invention which include a plurality of moveable support tiles, the tiles may be porous or perforated such that air, or other gas, can be supplied up through the pores or perforations to provide the gas cushion over the table surface. Similarly, the fixed portions of the table bearing surface may also be porous or perforated.

Moving on to FIG. 12, this figure is a schematic representation of part of another support table in accordance with an embodiment of the invention. Here, rather than using separate moveable support members or tiles, the support member 42 has a degree of flexibility, and the actuator system includes a plurality of actuator 61, each one coupled to the fixed base 41 and to a respective part of the flexible support member 42. By suitable control of the actuators the profile of the flexible support member 42 can be adjusted so as to control the topography of its upper surface 43. In use, an air cushion 50 is provided over the upper surface 43. Thus, the actuator system is arranged to deform the support member 43.

While specific embodiments of the invention have been described above, it will be appreciated that the invention may be practiced otherwise than as described. The description is not intended to limit the invention.

What is claimed is:

1. A lithographic apparatus comprising:

an illumination system configured to condition a beam of radiation;

a patterning system configured to impart the beam of radiation with a pattern in its cross-section;

a substrate table configured to support a substrate, said substrate table including a support member having an upper support surface configured to adjustably support at least part of a target portion of the substrate relative to a remaining portion of the substrate on a fluid cushion;

a projection system configured to project the patterned beam onto the target portion of the substrate, a fluid supply system arranged to supply fluid to said upper support surface so as to provide said fluid cushion; and an actuator system arranged to act on the support member and controllable to provide adjustment of a topography of the upper support surface relative to a reference plane.

2. The lithographic apparatus of claim 1, wherein the support member is movable and the actuator system is controllable to move the support member to provide adjustment of the topography.

3. The lithographic apparatus of claim 2, wherein the substrate table comprises a base, and the actuator system is controllable to move the movable support member relative to the base so as to provide adjustment of the topography.

4. The lithographic apparatus of claim 1, wherein the support member is deformable and the actuator system is controllable to deform the support member to provide adjustment of the topography.

5. The lithographic apparatus of claim 4, wherein the substrate table includes a base, and the actuator system is controllable to deform the movable support member relative to the base so as to provide adjustment of the topography.

6. The lithographic apparatus of claim 1, wherein the fluid is a gas, and the fluid supply system is a gas supply system.

7. The lithographic apparatus of claim 1, wherein the fluid supply system is arranged to supply said fluid through the support member to the upper support surface.

8. The lithographic apparatus of claim 2, wherein the movable support member is rigid.

9. The lithographic apparatus of claim 8, wherein the upper support surface is planar.

10. The lithographic apparatus of claim 8, wherein the actuator system is operable to adjust a height or a tilt angle of the upper support surface relative to the reference plane.

11. The lithographic apparatus of claim 10, wherein the actuator system is operable to adjust a tilt of the upper support surface about a first axis, and a tilt of the upper support surface about a second axis relative to the reference plane.

12. The lithographic apparatus of claim 11, wherein the first and second axes are mutually perpendicular.

13. The lithographic apparatus of claim 1, further comprising a fixed support member having a fixed upper support surface configured to support a portion of the substrate different from the target portion on a fluid cushion, the fluid supply system being further arranged to supply fluid to said fixed upper support surface so as to provide said cushion.

14. The lithographic apparatus of claim 13, wherein the substrate table comprises a base and the fixed support member is fixed relative to the base.

15. The lithographic apparatus of claim 1, wherein the fluid supply system is arranged to supply said fluid through one or more conduits in the substrate table to provide the fluid cushion to the target portion of the substrate.

16. The lithographic apparatus of claim 15, wherein the fluid supply system includes a regulator configured to direct the fluid through the one or more conduits.

17. The lithographic apparatus of claim 1, further comprising a sensor system arranged to detect a height of an upper surface of a substrate supported by the substrate table, and a control system responsive to the sensor system to control the actuator system to adjust the topography of the upper support surface of the support member according to the detected height.

18. The lithographic apparatus of claim 1, further comprising a sensor system arranged to detect the topography of an upper surface of a substrate supported by the substrate table, and a control system responsive to the sensor system to control the actuator system to adjust the topography of the upper support surface of the support member according to the detected topography.

19. The lithographic apparatus of claim 1, wherein the substrate table comprises a base, and the apparatus further comprises a movement system arranged to move a supported substrate relative to the base so as to position a different target portion of the substrate over the support member.

20. The lithographic apparatus of claim 1, wherein the substrate has an upper surface having a topography which includes an undulation at a characteristic wavelength, and wherein the support member has a dimension corresponding to one quarter of said wavelength.

21. A device manufacturing method comprising:
projecting a patterned beam of radiation onto a target portion of a substrate
adjustably supporting at least part of the target portion of the substrate relative to a remaining portion of the substrate on a fluid cushion on a support surface;
detecting the height, relative to a reference plane, of an upper surface of the substrate, and
adjusting a topography of the support surface, relative to the reference plane, so as to effect a desired change in said height.

22. The device manufacturing method of claim 21, wherein said supporting comprises supporting the target portion of the substrate on a fluid cushion on the upper support surfaces of a plurality of movable support members, wherein said detecting comprises detecting a topography of an upper surface of the substrate relative to the reference plane, and wherein said adjusting comprises selectively moving the support members to adjust a topography of their upper surfaces so as to effect a desired change to the topography of said upper surface of the supported substrate.

23. The device manufacturing method of claim 21, further comprising:
conveying the fluid through one or more conduits in the substrate table to provide the fluid cushion to the target portion of the substrate.

24. A substrate table for use in a lithographic apparatus, the substrate table comprising:
a support member including an upper support surface configured to adjustably support at least part of the target portion of the substrate relative to a remaining portion of the substrate on a fluid cushion;
a fluid conveying system arranged to convey fluid to said upper support surface so as to provide said fluid cushion; and
an actuator system arranged to act on the support member and controllable to provide adjustment of a topography of the upper support surface relative to a reference plane.

25. The substrate table of claim 24, wherein the fluid conveying system is arranged to supply said fluid through one or more conduits in the substrate table to provide the fluid cushion to the target portion of the substrate.

26. The substrate table of claim 25, wherein the fluid conveying system includes a regulator configured to direct the fluid through the one or more conduits.

27. A lithographic apparatus comprising:
an illumination system configured to condition a beam of radiation;
a patterning system configured to impart the beam of radiation with a pattern in its cross-section;
a substrate table configured to support a substrate, said substrate table including a support member having an upper support surface configured to support at least part of a target portion of the substrate on a fluid cushion, wherein the substrate table comprises a plurality of said support members, each of said plurality of said support members having a respective upper support surface configured to support a respective part of the target portion of the substrate on a respective fluid cushion;

a projection system configured to project the patterned beam onto the target portion of the substrate;

a fluid supply system arranged to supply fluid to said upper support surface so as to provide said fluid cushion, wherein the fluid supply system is arranged to supply fluid to each upper support surface so as to provide said respective fluid cushions; and an actuator system arranged to act on the support member and controllable to provide adjustment of a topography of the upper support surface relative to a reference plane, wherein the actuator system is arranged to act on the support members and is controllable to provide adjustment of a topography of each upper support surface relative to the reference plane.

28. The lithographic apparatus of claim 27, wherein the plurality of support members is movable and the actuator system is controllable to selectively move the plurality of support members so as to provide adjustment of the topography of the upper support surfaces.

29. The lithographic apparatus of claim 28, wherein the substrate table comprises a base and the actuator system is controllable to selectively move the support members relative to the base.

30. The lithographic apparatus of claim 28, wherein each of said plurality of movable support members is rigid.

31. The lithographic apparatus of claim 30, wherein the upper support surface of each of said plurality of movable support members is planar.

32. The lithographic apparatus of claim 31, wherein the upper support surface of each of said plurality of movable support members is rectangular.

33. The lithographic apparatus of claim 28, wherein the actuator system is operable to adjust a height or a tilt angle of the upper support surface of each movable support member relative to the reference plane.

34. The lithographic apparatus of claim 33, wherein the actuator system is operable to adjust a tilt of the upper support surface of each movable support member about first and second axes relative to the reference plane.

35. The lithographic apparatus of claim 34, wherein the first and second axes are mutually perpendicular.

36. The lithographic apparatus of claim 28, wherein each movable support member is a tile.

37. The lithographic apparatus of claim 27, wherein the plurality of support members is arranged as a regular array.

38. The lithographic apparatus of claim 27, comprising a fixed support member having a fixed upper support surface configured to support a portion of the substrate different from the target portion on a fluid cushion, the fluid supply system being further arranged to supply fluid to said fixed upper support surface so as to provide said cushion.

39. The lithographic apparatus of claim 38, wherein the substrate table comprises a base and the fixed support member is fixed relative to the base.

40. The lithographic apparatus of claim 38, wherein the fixed support member comprises a window and said plurality of support members are located inside the window, such that the fixed upper support surface surrounds the upper support surfaces of said plurality of support members.

41. The lithographic apparatus of claim 27, further comprising a sensor system arranged to detect a topography of an upper surface of a substrate supported by the substrate table, and a control system responsive to the sensor system to control the actuator system to adjust the topography of the upper support surfaces according to the detected topography.

42. The lithographic apparatus of claim 27, wherein the substrate table comprises a base, and the apparatus further comprises a movement system arranged to move a supported substrate relative to the base so as to position a different target portion of the substrate over the support members.

43. The lithographic apparatus of claim 42, wherein the movement system is adapted to scan a supported surface in a first of two mutually perpendicular directions.

44. The lithographic apparatus of claim 43, wherein the movement system further comprises a position sensing system arranged to detect the position of the supported substrate relative to the base.

45. The lithographic apparatus of claim 27, wherein the fluid supply system is arranged to supply said fluid through one or more conduits in the substrate table to provide the fluid cushion to the target portion of the substrate.

46. The lithographic apparatus of claim 45, wherein the fluid supply system includes a regulator configured to direct the fluid through the one or more conduits.

* * * * *